(12) United States Patent
Choi

(10) Patent No.: US 11,664,346 B2
(45) Date of Patent: May 30, 2023

(54) SEMICONDUCTOR PACKAGE INCLUDING SEMICONDUCTOR CHIPS AND DUMMY PAD

(71) Applicant: SAMSUNG ELECTRONICS CO., LTD., Suwon-si (KR)

(72) Inventor: Eunkyoung Choi, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 32 days.

(21) Appl. No.: 17/306,625

(22) Filed: May 3, 2021

(65) Prior Publication Data
US 2022/0013497 A1    Jan. 13, 2022

(30) Foreign Application Priority Data
Jul. 9, 2020   (KR) ......................... 10-2020-0084940

(51) Int. Cl.
| | | |
|---|---|---|
| H01L 25/065 | (2023.01) | |
| H01L 23/498 | (2006.01) | |
| H01L 23/31  | (2006.01) | |
| H01L 23/00  | (2006.01) | |

(52) U.S. Cl.
CPC ...... *H01L 25/0652* (2013.01); *H01L 23/3128* (2013.01); *H01L 23/49816* (2013.01); *H01L 23/49822* (2013.01); *H01L 24/16* (2013.01); *H01L 24/73* (2013.01); *H01L 2224/16227* (2013.01); *H01L 2224/16235* (2013.01); *H01L 2224/16237* (2013.01); *H01L 2224/73204* (2013.01); *H01L 2924/1431* (2013.01); *H01L 2924/1434* (2013.01); *H01L 2924/1815* (2013.01); *H01L 2924/3512* (2013.01)

(58) Field of Classification Search
CPC .......... H01L 25/0652; H01L 23/49816; H01L 23/49822; H01L 24/16; H01L 24/73; H01L 2224/16227; H01L 2224/16235; H01L 2224/16237; H01L 2224/73204; H01L 2924/1431; H01L 2924/1434; H01L 2924/1815
See application file for complete search history.

(56) References Cited

U.S. PATENT DOCUMENTS

| | | |
|---|---|---|
| 7,732,932 B2 | 6/2010 | Brofman et al. |
| 7,897,433 B2 | 5/2011 | Su et al. |
| 8,409,899 B2 | 4/2013 | Gambino et al. |
| 8,610,238 B2 | 12/2013 | Kaltalioglu et al. |
| 8,736,039 B2 | 5/2014 | Wu et al. |
| 8,877,611 B2 | 11/2014 | Mieczkowski et al. |
| 10,109,599 B2 | 10/2018 | Christiansen et al. |
| 10,115,650 B2 | 10/2018 | Wu et al. |
| 10,431,536 B2 | 10/2019 | Kim et al. |
| 11,282,792 B2 * | 3/2022 | Jee .................... H01L 23/49822 |

\* cited by examiner

*Primary Examiner* — Jasmine J Clark
(74) *Attorney, Agent, or Firm* — Volentine, Whitt & Francos, PLLC

(57) ABSTRACT

A semiconductor package includes semiconductor chips on a package substrate, and a dummy pad disposed between and the semiconductor chips and overlapping at least a portion of the semiconductor chips. The dummy pad being disposed on the package substrate and in a space between the package substrate and the semiconductor chips.

20 Claims, 15 Drawing Sheets

SEMICONDUCTOR PACKAGE INCLUDING SEMICONDUCTOR CHIPS AND DUMMY PAD

CROSS-REFERENCE TO RELATED APPLICATION

This application claims the benefit of Korean Patent Application No. 10-2020-0084940 filed on Jul. 9, 2020 in the Korean Intellectual Property Office, the subject matter of which is hereby incorporated by reference.

BACKGROUND

The inventive concept relates generally to semiconductor packages, and more particularly, to a type of semiconductor package referred to as a System-in-Package (SiP) in which a single semiconductor package includes different types of semiconductor chips.

The demand for portable devices in the electronic product market continues to expand. As a result, miniaturization and weight reduction of the constituent components within electronic products have become important design drivers. There are various approaches to the miniaturization and weight reduction of electronic components. For example, semiconductor packages mounted in the electronic components may provide high-capacity data processing, thereby reducing the overall volumes of semiconductor packages. Semiconductor chips mounted in the semiconductor packages may be densely or highly integrated within a single package. In this manner, various SiP techniques may be applied to efficiently arrange (or layout) multiple semiconductor chips within semiconductor packages.

SUMMARY

Embodiments of the inventive concept provide semiconductor packages including a dummy pad, which may prevent cracking in a molding member, thereby efficiently protecting different types of semiconductor chips facing each other in the limited structure provided by a semiconductor package. However, other benefits and technical objectives may be provided by embodiments of the inventive concept, as will be apparent to those of ordinary skill in the art upon consideration of the following description.

According to an aspect of the inventive concept, there is provided a semiconductor package including; a package substrate, a first semiconductor chip, a second semiconductor chip and a third semiconductor chip on the package substrate, and a dummy pad laterally disposed between and the first semiconductor chip, the second semiconductor chip and the third semiconductor chip to overlap at least a portion of the first semiconductor chip, the second semiconductor chip and the third semiconductor chip, wherein the dummy pad is disposed on the package substrate and in a space between the package substrate and the first semiconductor chip, the second semiconductor chip and the third semiconductor chip.

According to an aspect of the inventive concept, there is provided a semiconductor package including; a redistribution structure, at least three semiconductor chips on the redistribution structure, a dummy pad between the redistribution structure and the at least three semiconductor chips, and a molding member filling a space between the at least three semiconductor chips, such that the dummy pad overlaps at least a portion of each one of the at least three semiconductor chips, and the molding member covering at least a portion of a top surface of the dummy pad.

According to an aspect of the inventive concept, there is provided a semiconductor package including; an interposer, semiconductor chips, including a memory chip, a logic chip and a dummy chip, adjacently disposed on the interposer, a dummy pad disposed on the interposer and between the interposer and the semiconductor chips, wherein the dummy pad includes a metal material, a molding member covering a bottom surface and side surfaces of the semiconductor chips, wherein the molding member covers a top surface and side surfaces of the dummy pad and a solder bump adhered to a bottom surface of the interposer, wherein the dummy pad overlaps at least a portion of each one of the semiconductor chips.

BRIEF DESCRIPTION OF THE DRAWINGS

Embodiments of the inventive concept will be more clearly understood from the following detailed description taken in conjunction with the accompanying drawings in which.

DETAILED DESCRIPTION

Throughout the written description and drawings, like reference numbers and labels are used to denote like or similar elements and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; between; overlay/underlay; etc.

Figure 1:
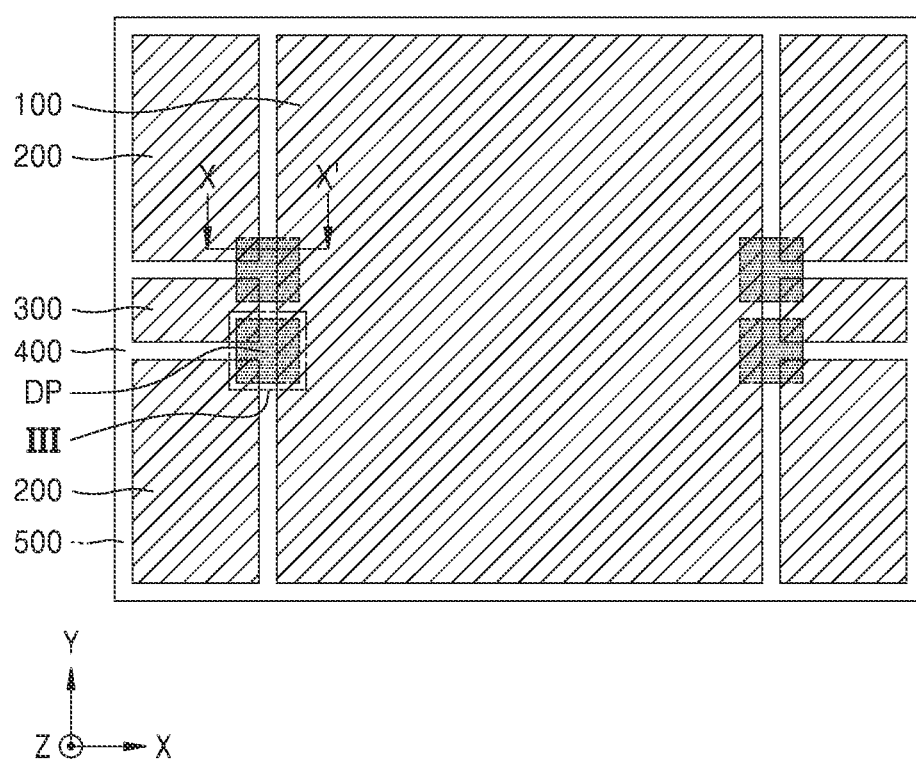
FIG. 1 is a plan (or top-down) view of a semiconductor package according to embodiments of the inventive concept.
Figure 2:
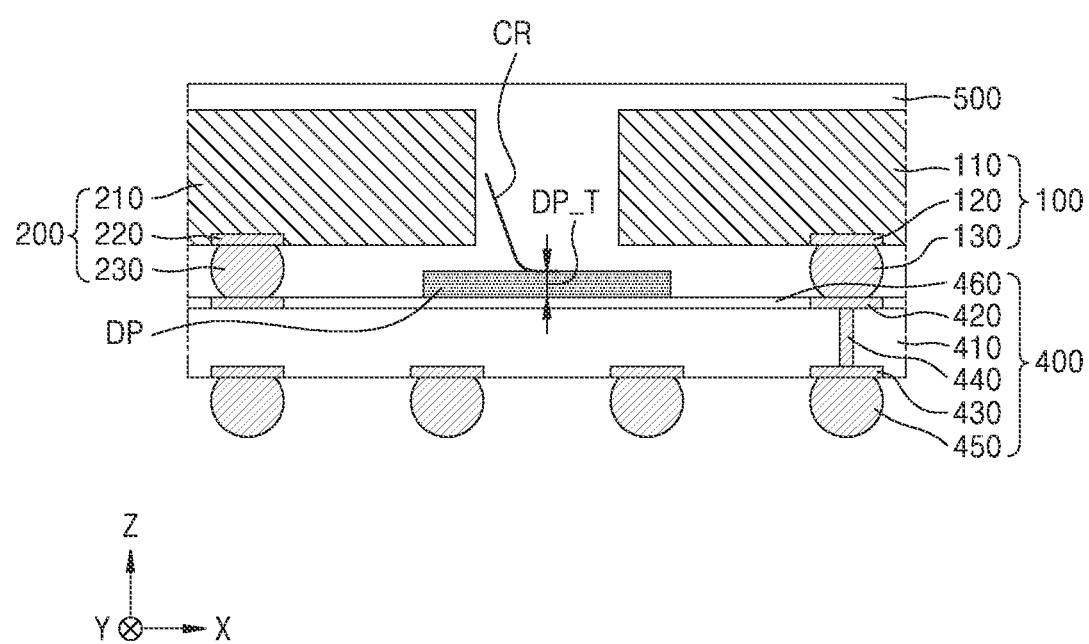
FIG. 2 is a cross-sectional view of taken along line X-X' of FIG. 1.
Figure 3:
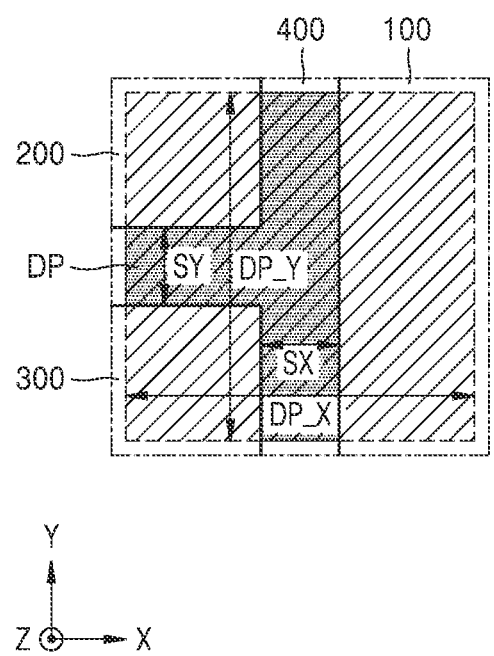
FIGS. 3, 4 and 5 are respective, enlarged cross-sectional views of portion III of FIG. 1.
Figure 4:
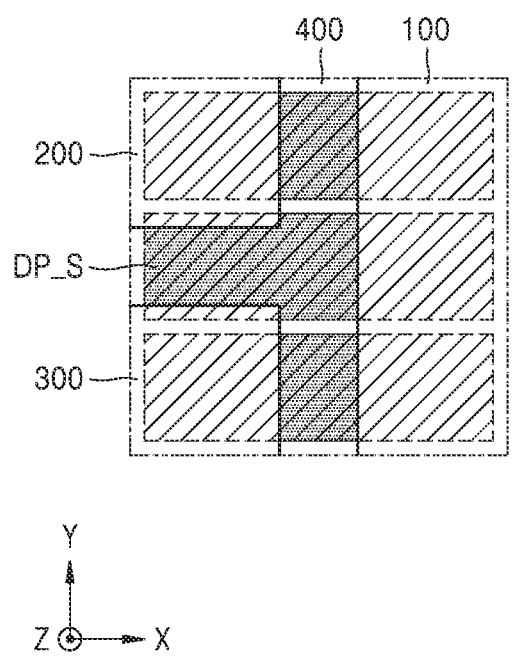
Figure 5:
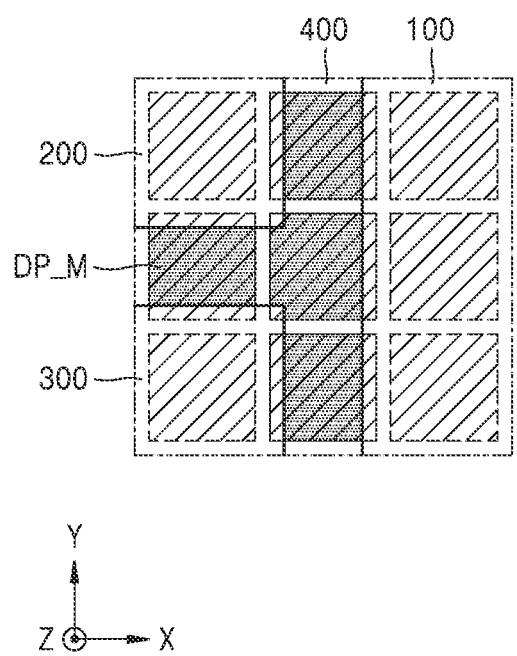

FIG. 1 is a plan (or top-down) view of a semiconductor package 10 according to embodiments of the inventive concept; FIG. 2 is a cross-sectional view taken along line X-X' of FIG; and FIGS. 3, 4 and 5 are respective, enlarged cross-sectional views of portion III of FIG. 1.

As variously illustrated in at least one of FIGS. 1, 2, 3, 4, and 5, the semiconductor package 10 may include at least a first semiconductor chip 100, a second semiconductor chip 200 and a third semiconductor chips 300 arranged on a package substrate 400 in relation to a molding member 500. A dummy pad DP is also provided on the package substrate 400.

Thus, the semiconductor package 10 may be understood as a structure in which multiple semiconductor chips are disposed (e.g., mounted) on the package substrate 400. In this regard, FIG. 1 illustrates an example in which seven (7) semiconductor chips are mounted on the package substrate 400. However, this is merely an arbitrarily selected example, and the scope of the inventive concept is not limited thereto. The first semiconductor chip 100, the second semiconductor chip 200 and the third semiconductor chip 300 may be arranged (or laid out) in a horizontal (or lateral) plane defined by a first direction (e.g., an X direction) and a second direction (e.g., a Y direction), wherein the first direction and the second direction are perpendicularly oriented in relation to one another. Further in this regard, the package substrate 400 may also be oriented according to a horizontal plane and the various semiconductor chips may be vertically disposed (e.g., mounted) in a third direction (e.g., a Z direction) on a top surface of the package substrate 400.

Here, the semiconductor chips of the similar type may be described as a group of chips. Thus, in the illustrated example of FIG. 1, the first semiconductor chip 100, the second semiconductor chip 200 and the third semiconductor chip 300 may be the same type of semiconductor chip, may be two (2) different types of semiconductor chips, or may be three (3) different types of semiconductor chips.

For example, the first semiconductor chip 100 and the second semiconductor chip 200 may be active chips, and the third semiconductor chip 300 may be a dummy chip. More specifically, the first semiconductor chip 100 may be a logic chip and the second semiconductor chip 200 may be a memory chip. However, type(s) of the first semiconductor chip 100, the second semiconductor chip 200 and the third semiconductor chip 300 may vary with design.

Here, a particular memory chip may be a volatile memory chip or a non-volatile memory chip. In some embodiments, the memory chip may be a high-bandwidth memory chip.

In this regard, the term volatile memory chip denotes one or more memory chips selected from a group including at least one of a dynamic random access memory (DRAM), a static RAM (SRAM), a thyristor RAM (TRAM), a zero-capacitor RAM (ZRAM) and a twin-transistor RAM (TTRAM). The term non-volatile memory chip denotes one or more memory chips selected from a group including at least one of flash memory, a magnetic RAM (MRAM), a spin-transfer torque MRAM (STT-MRAM), a ferroelectric RAM (FRAM), a phase-change RAM (PRAM), a resistive RAM (RRAM), a nanotube RRAM, a polymer RAM, a nano floating gate memory, a holographic memory, a molecular electronics memory, and an insulator resistance change memory.

The logic chip may be implemented as, for example, a microprocessor, a graphics processor, a signal processor, a network processor, a chipset, an audio codec, a video codec, an application processor, a System on Chip (SoC), etc. Here, a microprocessor may include a single core or a multi-core.

The dummy chip may be disposed in an empty region of the package substrate 400 (i.e., a region of the package substrate 400 unoccupied by the active chips). In some embodiments, the dummy chip may have shape and/or be formed of one or more appropriate material(s) to inhibit the warpage of the semiconductor package 10. For example, the dummy chip may include a material having a relatively low Young's modulus (e.g., a material having a Young's modulus lower than that of the molding member 500). In some embodiments, when the package substrate 400 may be a semiconductor substrate, such as a silicon wafer, the dummy chip may include the same material (or a similar material) as the package substrate 400.

In the illustrated example of FIG. 2, the first semiconductor chip 100 includes a first semiconductor substrate 110, a first connection pad 120 and a first connection member 130. Here, the first semiconductor substrate 110 may have an active surface and an opposing inactive surface opposite to the active surface. The active surface of the first semiconductor substrate 110 may be a surface facing a top surface of the package substrate 400. Various active element(s) and/or passive element(s) may be formed on the active surface of the first semiconductor substrate 110. One or more of these various element(s) may be electrically connected to the first connection pad 120.

A first connection member 130 may be formed between the active surface of the first semiconductor substrate 110 and the package substrate 400. In some embodiments, the first connection member 130 may directly contact the first connection pad 120. The first semiconductor chip 100 may be electrically connected to the package substrate 400 through the first connection member 130.

The first semiconductor substrate 110 may include, for example, silicon (Si). Alternatively, the first semiconductor substrate 110 may include a semiconductor element, such as germanium (Ge), or a compound semiconductor, such as silicon carbide (SiC), gallium arsenide (GaAs), indium arsenide (InAs), and indium phosphide (InP). Alternately, the first semiconductor substrate 110 may have a silicon-on-insulator (SOI) structure. For example, the first semiconductor substrate 110 may include a buried oxide (BOX) layer. The first semiconductor substrate 110 may include an active region, for example, a doped well or a doped structure. The first semiconductor substrate 110 may include various device isolation structures, such as a shallow trench isolation (STI) structure.

A semiconductor device layer (not shown) may be formed on the active surface of the first semiconductor substrate 110. The semiconductor device layer may include various semiconductor wiring layer(s) configured to connect various elements associated with the first semiconductor substrate 110. The semiconductor wiring layer(s) may respectively include metal wiring layer(s) and/or through vias (e.g., contacts, plugs etc.). In some embodiments, the semiconductor wiring layer may be a multilayered structure including at least two metal wiring layers or at least two via plugs that may be alternately stacked.

The first connection pad 120 may be disposed on the semiconductor device layer and may be electrically connected to the semiconductor wiring layer(s). In this regard, the semiconductor wiring layer(s) may be electrically connected to the first connection member 130 through the first connection pad 120. Here, the first connection pad 120 may include, for example, at least one of aluminum (Al), copper (Cu), nickel (Ni), tungsten (W), platinum (Pt), and gold (Au).

A passivation layer (not shown) may be formed on the semiconductor device layer to protect the semiconductor device layer, the semiconductor wiring layer, and/or other structures subject to external mechanical impact, moisture and contamination. When provided, the passivation layer may selectively expose at least a portion of the first connection pad 120.

The first connection member 130 may be adhered to the first connection pad 120. The first connection member 130 may be used to electrically connect the first semiconductor chip 100 to the package substrate 400. That is, the first connection member 130 may provide an electrical connection through which the first semiconductor chip 100 receives at least one externally provided signal (e.g., a ground signal, a power signal, a command signal, an address signal, a data signal, etc.) associated with the execution of an operation (e.g., a read operation, a program (or write) operation, an erase operation, etc.) by the first semiconductor chip 100. The first connection member 130 may include, for example, at least one of a pillar structure, a solder bump, a solder ball and a solder layer.

The second semiconductor chip 200 may include a second semiconductor substrate 210, a second connection pad 220 and a second connection member 230. Like the first semiconductor chip 100, the second semiconductor chip 200 may include a second semiconductor substrate 210 having an active surface and an opposing inactive surface, wherein the active surface is a surface facing the top surface of the package substrate 400. Here again, various active element(s) and/or passive element(s), as well as the second connection pad 220, may be formed on the second semiconductor substrate 210.

The second connection member 230 may be formed between the active surface of the second connection pad 220 and the package substrate 400. In some embodiments, the second connection member 230 may directly contact the second connection pad 220. The second semiconductor chip 200 may be electrically connected to the package substrate 400 through the second connection member 230.

The third semiconductor chip 300 may include a third semiconductor substrate and an adhesive film (not shown). The third semiconductor chip 300 may include a third semiconductor substrate having a top surface and an opposing bottom surface, opposite to the top surface. The bottom surface of the third semiconductor substrate may be a surface facing the top surface of the package substrate 400. Because the third semiconductor chip 300 is a dummy chip, no active element(s), passive element(s) or a third connection pad will usually be formed on the third semiconductor substrate, unlike the first semiconductor chip 100 and the second semiconductor chip 200.

The adhesive film may be formed between the bottom surface of the third semiconductor chip 300 and the top surface of the package substrate 400. In some embodiments, the adhesive film may be a non-conductive film (NCF), and the third semiconductor chip 300 may be adhered to the package substrate 400 through the adhesive film. However, the inventive concept is not limited thereto, and the third semiconductor chip 300 may also be variously attached to the package substrate 400 (e.g., using substantially the same approaches used to mount the first semiconductor chip 100 and/or the second semiconductor chip 200).

In some embodiments like the one illustrated in FIG. 1, the second semiconductor chip 200 and the third semiconductor chip 300 may be laterally arranged along one side of the first semiconductor chip 100. That is, the second semiconductor chip 200 and the third semiconductor chip 300 may be arranged in parallel (in relation to the X direction or the Y direction) along one side of the first semiconductor chip 100. In some embodiments, the third semiconductor chip may be arranged between the two (2) second semiconductor chips 200. However, those skilled in the art will recognize that multiple semiconductor chips may be variously arranged in relation to a first semiconductor chip 100.

In the illustrated example of FIG. 2, the package substrate 400 (i.e., a support substrate) includes a body unit 410, a lower protective layer and an upper protective layer. The package substrate 400 may be a printed circuit board (PCB), a wafer substrate, a ceramic substrate, a glass substrate, an interposer, etc.

The package substrate 400 may further include a wiring 440 (e.g., one or more signal transmission paths) electrically connected to at least one of first semiconductor chip 100 and the second semiconductor chip 200 through at least one the first connection member 130 and the second connection member 230 via an upper electrode pad 420 formed in the top surface of the package substrate 400. Additionally, an external connection terminal 450 may be disposed on a lower electrode pad 430 formed in a bottom surface of the package substrate 400, such that the package substrate 400 may be electrically connected to (and mounted on) a module substrate or a system board of an electronic product.

The wiring 440 may have a multilayered structure or a single layer structure and may be formed in the body unit 410. With the foregoing configuration, the external connection terminal 450 may be electrically connected to at least one of the first semiconductor chip 100 and the second semiconductor chips 200 through the wiring 440.

In some embodiments, the package substrate 400 is an interposer, and the package substrate 400 may include the body unit 410 and the wiring 440 formed in the body unit 410. The body unit 410 may include a silicon wafer including silicon (Si), for example, crystalline silicon, polycrystalline silicon, or amorphous silicon.

In this regard, the interposer may further include a circuit region. For example, a buffer circuit capable of controlling capacitance loading of the first semiconductor chip 100 and/or the second semiconductor chip 200 may be formed in the circuit region. In some embodiments, a semiconductor integrated circuit (IC) including at least one selected from a transistor, a diode, a capacitor, and a resistor may be formed in the circuit region. However, the circuit region may be omitted in other embodiments.

In some embodiments, the package substrate 400 may include a PCB. In such embodiments, the formation of the body unit 410 may include at least (1) forming a thin film by compressing a polymer material (e.g., a thermosetting resin), an epoxy-based resin (e.g., flame retardant 4 (FR-4), bismaleimide triazine (BT), and ajinomoto build-up film (ABF), or a phenol resin to a constant thickness, (2) coating both sides of the thin film with copper foil (or some other conductive material), and (3) performing a patterning process to form the wiring 440. The entire top surface and/or the entire bottom surface of the body unit 410, except for portions connected to terminals (e.g., the upper electrode pad 420 and the lower electrode pad 430) may be coated with a solder resist to form the upper protective layer and the lower protective layer.

In this regard, the foregoing PCB may be a single-sided PCB in which the wiring 440 is formed on only one surface, or a double-sided PCB in which the wiring 440 is formed on both surfaces. In some embodiments, a PCB having a multi-layered structure may be implemented using at least three layers of copper foil formed using an insulator such as prepreg. At least three wirings 440 may then be formed according to the number of formed layers of copper foil. However, the package substrate 400 is not limited to the above-described structure or material(s) of the PCB.

The molding member 500 may be formed to at least substantially surround side surfaces, bottom surfaces, and top surfaces of the first semiconductor chip 100, the second semiconductor chip 200 and the third semiconductor chip 300. However, at least some portion of the top surfaces of the first semiconductor chip 100, the second semiconductor chip 200 and the third semiconductor chip 300 may be exposed by the molding member 500.

In some embodiments, the molding member 500 may include an epoxy molding compound. The epoxy molding compound may have a modulus of between about 15 GPa to about 30 GPa, and a coefficient of thermal expansion (CTE) of between about 3 ppm to about 30 ppm. Alternately or additionally, the molding member 500 may include various materials, such as epoxy-based material, a thermosetting material, a thermoplastic material, and an ultraviolet (UV)-processing material. Thermosetting materials may include phenol-type, acid-anhydride-type, and amine-type curing agents and an acrylic polymer additive.

Moreover, the molding member 500 may be formed using a molded under-fill (MUF) process. Thus, a material covering outer portions of the first semiconductor chip 100, the second semiconductor chip 200 and the third semiconductor chip 300 may be the same as a material filling the various spaces between the first semiconductor chip 100, the second semiconductor chip 200, the third semiconductor chip 300 and/or the package substrate 400.

In some embodiments, the first connection member 130 and the second connection member 230 may be respectively disposed between the first semiconductor chip 100 and the second semiconductor chip 200, and the package substrate 400. An adhesive film (not shown) may be disposed between the third semiconductor chip 300 and the package substrate 400. In some embodiments, the first connection member 130 and the second connection member 230 and the adhesive film (not shown) may be surrounded by the molding member 500.

To form the molding member 500, a molding material may be injected onto the package substrate 400 using an injection process, and may thereafter be cured using a curing process. Thus, the molding member 500 may form an outer shape of the semiconductor package 10. When necessary, an outer shape of the semiconductor package 10 may be formed by applying pressure to the molding material by means of a pressurizing process (e.g., using a press). Here, process conditions, such as a delay time between the injection and pressurizing of the molding material, the amount of injected molding material, as well as the pressurizing temperature/pressure conditions may be set considering physical properties (e.g., the viscosity) of the molding material.

A side surface and a top surface of the molding member 500 may form a right-angled corner (e.g., an angle of about 90°). During a process of forming individual semiconductor packages 10 by cutting the package substrate 400 along dicing lines, the side surface and the top surface of the molding member 500 may typically have the right-angled corners. Although not shown, a marking pattern (e.g., barcodes, numbers, letters, and symbols) including information about the semiconductor package 10 may be formed on a portion of a side surface of the semiconductor package 10.

With the foregoing configuration, the molding member 500 may protect the first semiconductor chip 100, the second semiconductor chip 200 and the third semiconductor chip 300 from external impacts, shocks, moisture and contamination. Thus, the molding member 500 may have a thickness sufficient to surround at least the first semiconductor chip 100, the second semiconductor chip 200 and the third semiconductor chip 300. Because the molding member 500 completely covers the package substrate 400, the width of the molding member 500 may be substantially equal to a width of the semiconductor package 10.

In the illustrated examples of FIGS. 1 and 2, the dummy pad DP is disposed on the package substrate 400 to at least partially overlap the first semiconductor chip 100, the second semiconductor chip 200 and the third semiconductor chip 300. As shown in some additional detail in FIG. 3, the dummy pad DP may overlap a portion of each of the first semiconductor chip 100, the second semiconductor chip 200 and the third semiconductor chip 300. To satisfy this requirement, a lateral width (DP_X) of the dummy pad DP in the first direction must be greater than a lateral distance (SX) between the first semiconductor chip 100 and either of the second semiconductor chip 200 and the third semiconductor chip 300. Further, a longitudinal width (DP_Y) of the dummy pad DP in the second direction must be greater than a longitudinal distance (SY) between the second semiconductor chip 200 and the third semiconductor chip 300.

Here it should be noted that if the dummy pad DP is too small in both lateral width (DP_X) and longitudinal width (DP_Y), cracking may form. (See, e.g., element CR of FIG. 2). However, if the dummy pad PD is too large, the overall layout of the semiconductor chips may be adversely affected.

Accordingly, in some embodiments, the lateral width (DP_X) of the dummy pad DP may range from about 120% to about 300% of the lateral distance (SX) between the first semiconductor chip 100 and either one of the second semiconductor chip 200 and the third semiconductor chip 300. Additionally or alternatively, the longitudinal width (DP_Y) of the dummy pad DP may range from about 120% to about 300% of the longitudinal distance (SY) between the second semiconductor chip 200 and the third semiconductor chip 300. In some particular embodiments, the foregoing results in a dummy pad DP having a lateral width (DP_X) and a longitudinal width (DP_Y) that ranges between about 50 µm to about 90 µm.

In some embodiments, a top surface of the dummy pad DP may overlap one side edge of the first semiconductor chip 100, as well as a side edge for both the second semiconductor chip 200 and the third semiconductor chips 300. Accordingly, the entire top surface of the dummy pad DP may be covered by the molding member 500, and the molding member 500 may extend in a T-shape from the top surface of the dummy pad DP. (See, e.g., FIG. 2).

The dummy pad DP may include at least one metal material, such as aluminum (Al), copper (Cu), nickel (Ni), tungsten (W), platinum (Pt) and gold (Au). However, the dummy pad DP may be electrically isolated (i.e., not electrically connected to any one of the first semiconductor chip 100, the second semiconductor chip 200, the third semiconductor chip 300, or any other active component or signal path of the package substrate 400.

To this end, exposed portions of the dummy pad DP may be surrounded by one or more insulating material(s). That is, the top surface and side surfaces of the dummy pad DP may be surrounded (or encapsulated) by the molding member 500, while a bottom surface of the dummy pad DP is adhered to (or contacts) an insulating member 460 disposed on the upper surface of the package substrate 400. Here, the insulating member 460 may be formed of one or more electrically insulating material(s), such as silicon oxide or silicon nitride.

As illustrated in FIG. 2, the dummy pad DP may be laterally disposed in a space (e.g., in an X/Y plane) between the first semiconductor chip 100, the second semiconductor chip 200 and the third semiconductor chip 300. The dummy pad DP may also be disposed in a vertical space (e.g., a vertical void extending in the Z direction) between the package substrate 400 and each one of the first semiconductor chip 100, the second semiconductor chip 200 and the third semiconductor chip 300. Accoridngly, a thickness (DP_T) of the dummy pad DP may be less than a separating distance between the first connection member 130 and the second connection member 230. Thus, a top surface of the dummy pad DP may be at a lower level than either top surface of the first connection member 130 and the second connection member 230. In some particular embodiments, the foregoing may result in a thickness DP_T for the dummy pad DP ranging from about 3 µm to about 30 µm.

As shown in FIG. 3, the dummy pad DP may have a flat panel shape in the form of a single rectangle. Alternately, as shown in FIG. 4, a dummy pad (DP_S) may have a stripe shape in the form of multiple parallel rectangles. Alternately, as shown in FIG. 5, a dummy pad (DP_M) may have a matrix shape in the form of an array of rectangles. That is, the dummy pad DP may be variously shaped to meet design requirements and priorities. Nonetheless, regardless of overall shape, the dummy pad DP will overlap at least a portion of the first semiconductor chip 100, the second semiconductor chip 200 and the third semiconductor chip 300, as described above (i.e., having a lateral width (DP_X) greater than the distance (SX) between the first semiconductor chip 100 and either one of the second semiconductor chip 200 and the third semiconductor chip 300, and having a longitudinal width (DP_Y) greater than the distance (SY) between the second semiconductor chip 200 and the third semiconductor chip 300.

As noted above, various a SiP approaches (s) have been applied to efficiently arrange the semiconductor chips in the limited, available structure provided by semiconductor packages, like the semiconductor package 10 of FIG. 1. However, typical SiP approaches result in different types of semiconductor chips being very closely arranged, wherein the resulting (separating) spaces between adjacent semiconductor chips are filled with a molding member. As a result, there may be area(s) in the semiconductor package wherein differences between the respective CTE of various materials included in a package substrate, various semiconductor chip(s) and various molding member(s) come into consideration. Accordingly, when a temperature change occurs during the manufacture of the semiconductor package, respective components may expand or contract differently. Such disparate and varying expansion and/or contraction may result in deformation (e.g., warpage) of the semiconductor package. And such warpage may cause cracking (e.g., extending from an upper portion to a lower portion of the molding member) to occur in a region thermally influenced by differences in CTE. In some cases, cracking may extend to a top surface of the package substrate, thereby exposing internal components to external conditions and causing defects in the semiconductor package.

To address the above-described problem, in semiconductor packages according to the embodiments of the inventive concept, the dummy pad DP may be efficiently arranged on the package substrate 400 to minimize possible warpage caused by the differences in CTE in region(s) proximate to the confluence of the first semiconductor chip 100, the second semiconductor chip 200 and the third semiconductor chip 300. That is, the dummy pad DP may be disposed in a region wherein the first semiconductor chip 100, the second semiconductor chip 200 and the third semiconductor chip 300 face-to-face oppose each other in order to prevent or minimize the propagation of cracking in the molding member 500. As a consequence, in semiconductor packages according to embodiments of the inventive concept, defects that result from cracking may be inhibited or minimized by using the dummy pad DP as described above. And this consequence is apparent even in a highly integrated SiP, thereby improving reliability and productivity.

Figure 6:
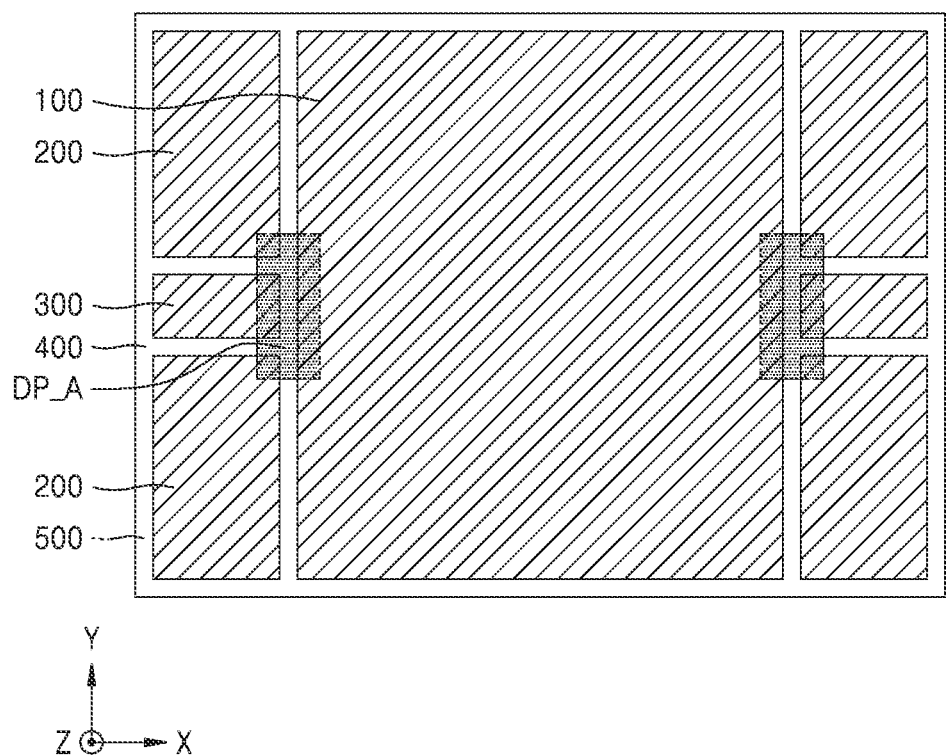
FIGS. 6, 7 and 8 are respective, plan views of semiconductor packages according to embodiments of the inventive concept.
Figure 7:
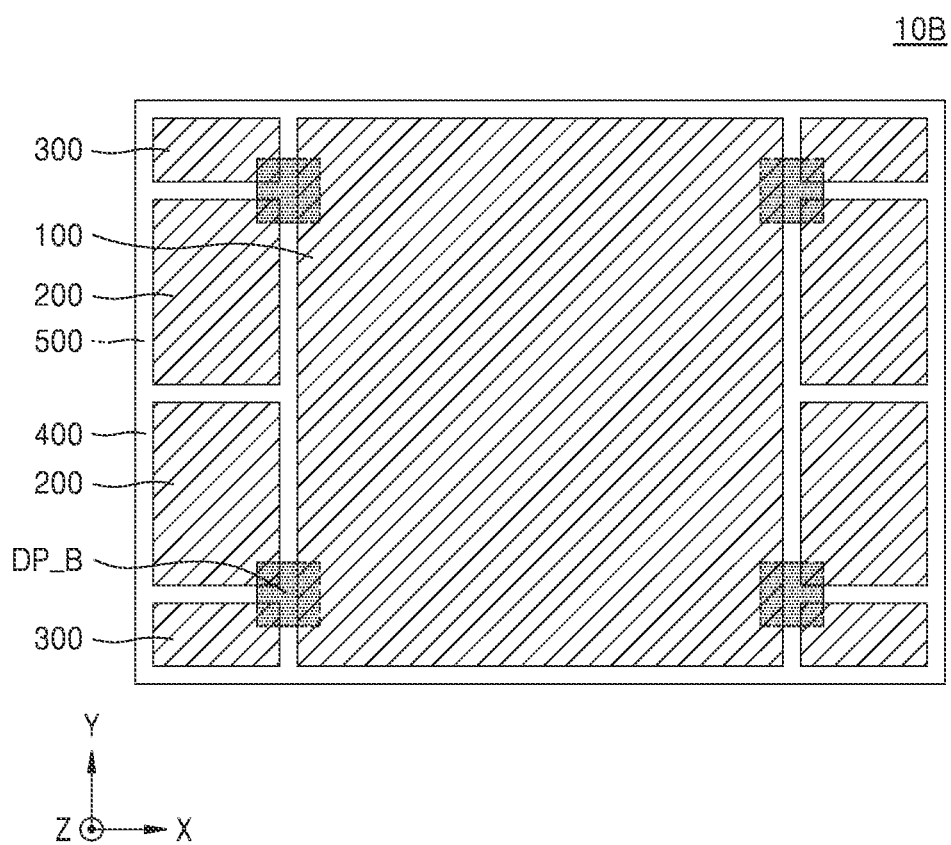
Figure 8:
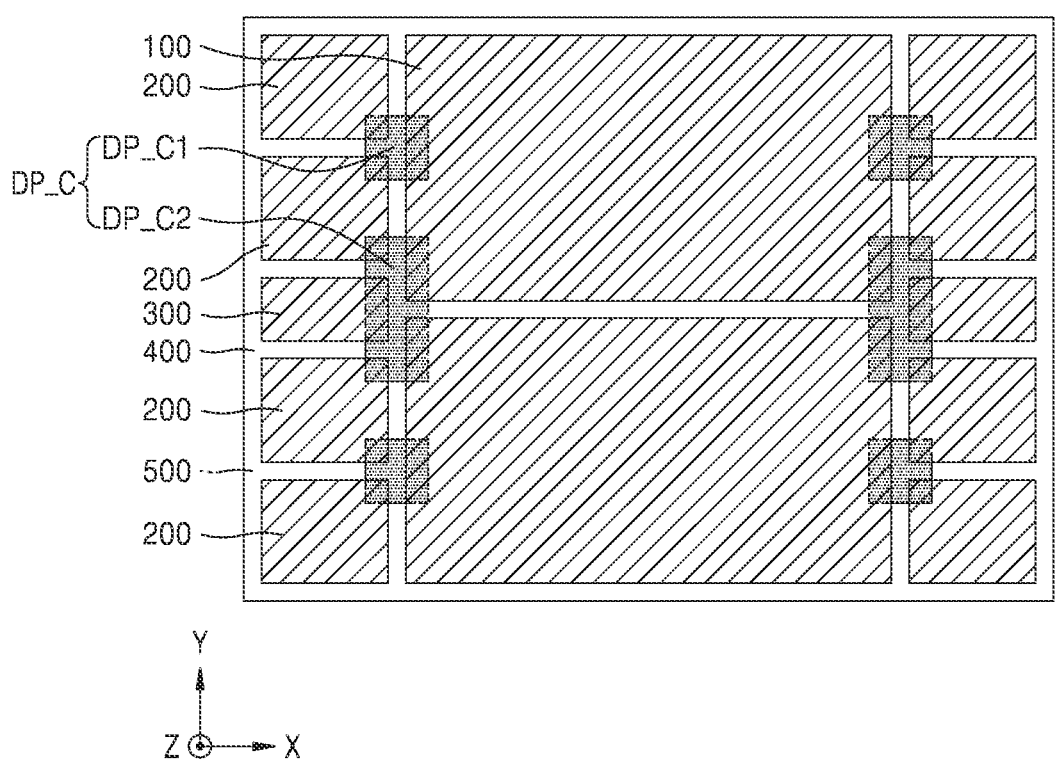

FIGS. 6, 7 and 8 are respective plan views of semiconductor packages 10A, 10B, and 10C according to embodiments of the inventive concept.

Respective components included in the semiconductor packages 10A, 10B, and 10C described below and materials included in the components are substantially the same as those described above with reference to FIGS. 1 to 5. Accordingly, only the differences between each of the semiconductor packages 10A, 10B, and 10C and the semiconductor package 10 of FIG. 1 will be primarily described.

FIG. 6 illustrates the semiconductor package 10A including the first semiconductor chip 100, four (4) second semiconductor chips 200, two (2) third semiconductor chips 300, the package substrate 400, the molding member 500 and multiple dummy pads (DP_A), wherein each third semiconductor chip 300 is laterally bracketed by two (2) of the second semiconductor chips 200.

Accordingly, each of the dummy pads (DP_A) is disposed on the package substrate 400 between the first semiconductor chip 100, two (2) of the second semiconductor chips 200 and one of the third semiconductor chips 300. As may be seen in plan, the dummy pad (DP_A) overlaps a portion of each one of the first semiconductor chip 100, the two (2) second semiconductor chips 200 and the third semiconductor chip 300. That is, one dummy pad (DP_A) overlaps a portion of four (4) semiconductor chips.

In some embodiments, a first side of the dummy pad (DP_A) may extend under the first semiconductor chip 100 and an opposing second side of the dummy pad (DP_A) may extend under the combination of the two (2) second semiconductor chips 200 and the third semiconductor chip 300. Accordingly, the entire top surface of the dummy pad (DP_A) may be covered by the molding member 500, and the molding member 500 may extend in a double-T shape from the top surface of the dummy pad (DP_A).

FIG. 7 illustrates a semiconductor package 10B including the first semiconductor chip 100, four (4) second semiconductor chips 200 and four (4) third semiconductor chips 300, the package substrate 400, the molding member 500 and multiple dummy pads (DP_B) wherein a pair of the second semiconductor chips 200 is laterally bracketed by two (2) of the third semiconductor chips 300.

Accordingly, each of the dummy pads (DP_B) is disposed on the package substrate 400 between the first semiconductor chip 100, one of the second semiconductor chips 200 and one of the third semiconductor chips 300. As may be seen in plan, the dummy pad (DP_B) overlaps a portion of each one of the first semiconductor chip 100, the one of the second semiconductor chips 200 and the one of the third semiconductor chips 300. That is, one dummy pad (DP_B) overlaps a portion of three (3) semiconductor chips.

In some embodiments, a first side of the dummy pad (DP_B) may extend under the first semiconductor chip 100 and an opposing second side of the dummy pad (DP_B) may extend under the combination of the one of the second semiconductor chips 200 and the one of the third semiconductor chips 300. Accordingly, the entire top surface of the dummy pad (DP_B) may be covered by the molding member 500, and the molding member 500 may extend in a T shape from the top surface of the dummy pad (DP_B).

FIG. 8 illustrates a semiconductor package 10C including eight (8) second semiconductor chips 200 and two (2) third semiconductor chips 300 on left and right sides of two first semiconductor chips 100.

The dummy pad (DP_C) may be between the first semiconductor chip 100, the second semiconductor chip 200 and the third semiconductor chip 300 and the package substrate 400. As viewed in plan, the dummy pad (DP_C) may overlap a portion of each of the first semiconductor chip 100, the second semiconductor chip 200 and the third semiconductor chip 300. Here, one dummy pad (DP_C1), which is a portion of the dummy pad (DP_C), may overlap three (3) semiconductor chips. Also, another dummy pad (DP_C2), which is another portion of the dummy pad (DP_C), may overlap five (5) semiconductor chips. That is, dummy pads (DP_C) effectively having different sizes may be included in the semiconductor package 10C.

A top surface of the dummy pad (DP_C1), which is the portion of the dummy pad (DP_C), may overlap one side of the first semiconductor chip 100 and overlap one edge of each of the second and third semiconductor chips 200 and 300. Accordingly, the entire top surface of the dummy pad (DP_C1) may be covered by the molding member 500, and the molding member 500 may extend in a T-shape from the top surface of the dummy pad (DP_C)1. That is, one dummy pad (DP_C1) may overlap three (3) semiconductor chips.

A top surface of the dummy pad (DP_C2), which is the other portion of the dummy pad (DP_C), may overlap one side of the third semiconductor chip 300 and overlap one edge of each of the first and second semiconductor chips 100 and 200. Accordingly, the entire top surface of the dummy pad (DP_C2) may be covered by the molding member 500, and the molding member 500 may extend in a triple-T shape from the top surface of the dummy pad (DP_C2). That is, the other dummy pad (DP_C2) may overlap five (5) semiconductor chips.

The foregoing examples are merely representative of many semiconductor chip arrangements that may benefit from the inclusion of one or more dummy pads according to embodiments of the inventive concept. In this regard, the dummy pads may have various shapes and sizes according to design variation.

FIGS. 9 to 14 are respective cross-sectional views taken along line X-X' of FIG. 1 according to embodiments of the inventive concept.

Respective components included in semiconductor packages 20, 30, 40, 50, 60, and 70 of FIGS. 9 to 14, as well as materials included in the components may be substantially the same as those described above with reference to the semiconductor package 10 of FIG. 2. Accordingly, only differences between each of the semiconductor packages 20, 30, 40, 50, and 60 and the semiconductor package 10 of FIG. 2 will be primarily described. Although the third semiconductor chip 300 of FIG. 1 is not illustrated in the embodiments of FIGS. 9 to 14, the various semiconductor packages 20, 30, 40, 50, and 60 may include one or more third semiconductor chip(s) 300, according to the inventive concept described above.

Figure 9:
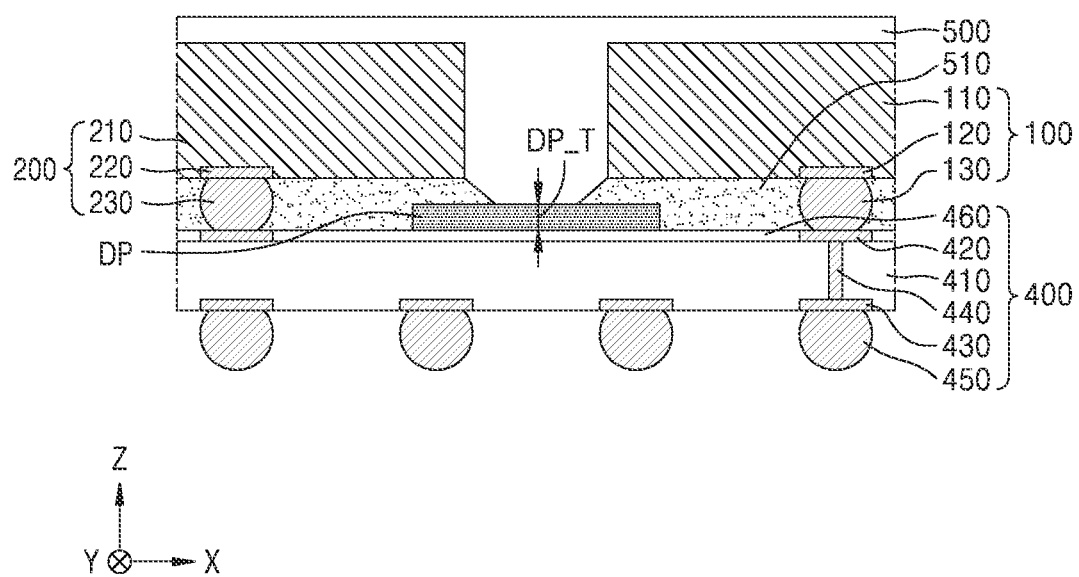
FIGS. 9, 10, 11, 12, 13 and 14 (collectively, "FIGS. 9 to 14") are respective cross-sectional views taken along line X-X' of FIG. 1 according to embodiments of the inventive concept.

FIG. 9 illustrates the semiconductor package 20 including the first semiconductor chip 100, the second semiconductor chip 200, the package substrate 400, the molding member 500, an under-fill 510 and a dummy pad DP.

Here, the under-fill 510 may be formed between the package substrate 400 and the first and second semiconductor chips 100 and 200. During a process of electrically connecting first and second connection members 130 and 230 to the first and second semiconductor chips 100 and 200, gaps may be formed between the package substrate 400 and the first and second semiconductor chips 100 and 200. Because the gaps may cause problems in the reliability of connections between the first and second semiconductor chips 100 and 200 and the package substrate 400, the under-fill 510 may be injected to reinforce the connection(s) therebetween. In some cases, an MUF process may be used instead of the under-fill 510.

A portion of a top surface and a side surface of the dummy pad DP may be covered by the under-fill 510, and a remaining portion of the top surface of the dummy pad DP may be covered by the molding member 500. That is, the dummy pad DP may be completely surrounded by an insulating member 460, the molding member 500, and the under-fill 510, which include three different kinds of insulating materials.

The entire top surface of the dummy pad DP may be covered by the molding member 500 and the under-fill 510, and the molding member 500 may extend in a T-shape from the top surface of the dummy pad DP.

The dummy pad DP may be located in an empty space between the first and second semiconductor chips 100 and 200 and the package substrate 400. As may be seen from FIG. 9, the first and second semiconductor substrates 110 and 210 may be spaced apart from the package substrate 400 in a third direction (e.g., the Z direction) by the first and second connection members 130 and 230. The dummy pad DP may be arranged in the resultant empty space. Thus, a thickness DP_T of the dummy pad DP may be less than the distance separating the first and second connection members 130 and 230 from the top surface of the dummy pad DP. In this regard, the thickness DP_T of the dummy pad DP may be less than a thickness of the under-fill 510, and the top surface of the dummy pad DP may be at a lower level than a top surface of the under-fill 510.

Figure 10:
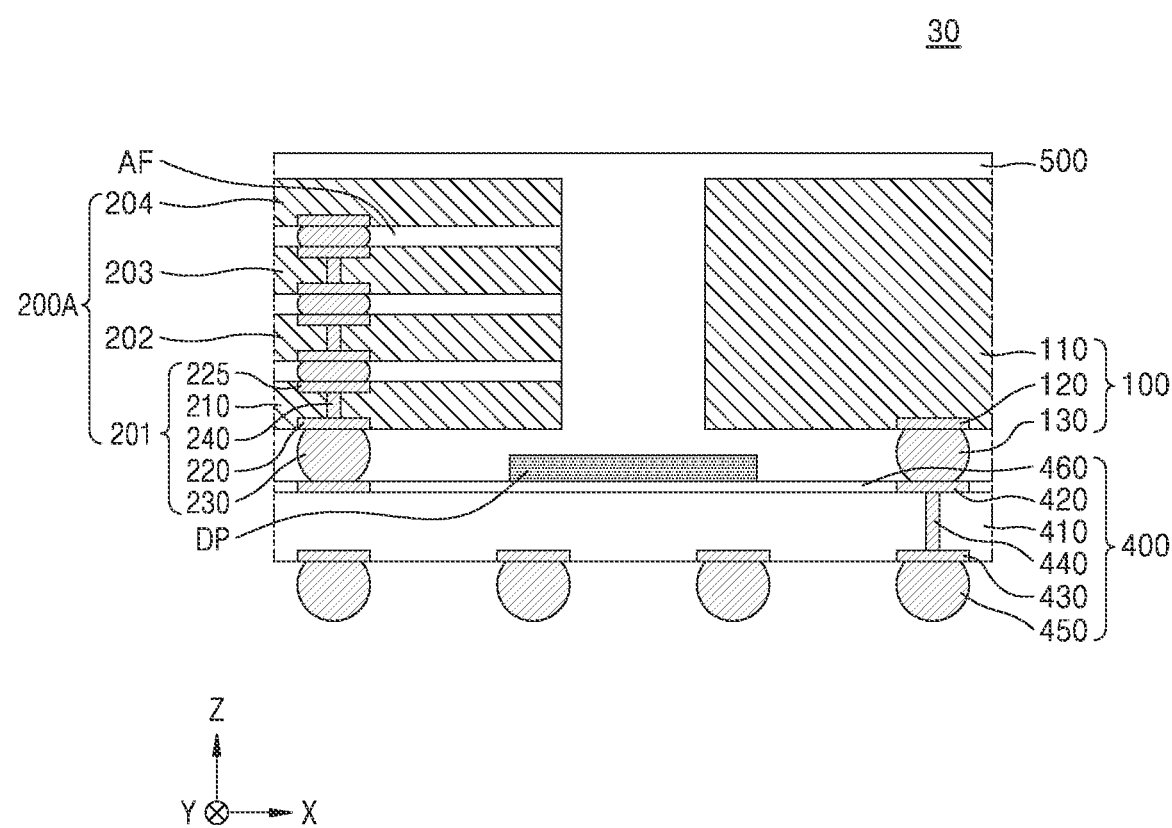

FIG. 10 illustrates a semiconductor package 30 including the first semiconductor chip 100, a stacked second semiconductor chips 200A, the package substrate 400, the molding member 500 and a dummy pad DP.

Here, the first semiconductor chip 100 may include a single logic chip and be implemented as, for example, a microprocessor, a graphics processor, a signal processor, a network processor, a chipset, an audio codec, a video codec, an application processor, or a SoC, without being limited thereto.

The stacked second semiconductor chip 200A may include a set of memory chips, including a plurality of slices (e.g., 201, 202, 203, and 204) capable of merging data with each other. The slices 201, 202, and 203 included in the stacked second semiconductor chip 200A may include a semiconductor substrate 210 having an active surface and an inactive surface, which are opposite to each other, an upper connection pad 225, and a through-silicon via (TSV) 240 formed through the semiconductor substrate 210. In another case, an uppermost slice (e.g., the slice 204) may not include the upper connection pad 225 and the TSV 240.

The number of slices (e.g., 201, 202, 203, and 204) included in the second semiconductor chip 200A may vary according to the purpose of the semiconductor package 30. That is, the number of slices (e.g., 201, 202, 203, and 204) included in the second semiconductor chip 200A is not limited to that shown in FIG. 10.

The slices 201, 202, 203, and 204 included in the stacked second semiconductor chip 200A may be stacked on (and adhered to) each other through a connection member 230 and an adhesive film (AF) provided around the connection member 230. The adhesive film AF may be a die-attach film. Die-attach films may be divided into inorganic adhesives and polymer adhesives. Alternatively, a hybrid type prepared by mixing an inorganic adhesive and a polymer adhesive may be used.

Figure 11:
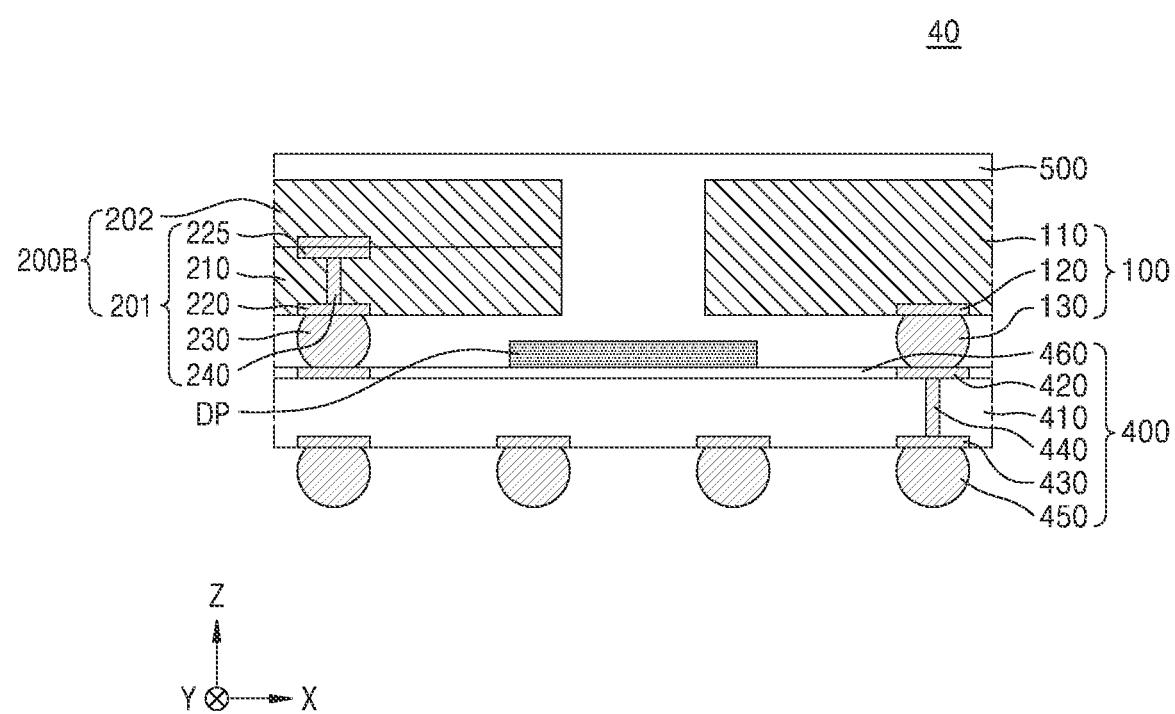

FIG. 11 illustrates a semiconductor package 40 including the first semiconductor chip 100, dual (upper/lower) second semiconductor chips 200B, the package substrate 400, the molding member 500 and a dummy pad DP.

The first semiconductor chip 100 may include a single logic chip and be implemented as, for example, a microprocessor, a graphics processor, a signal processor, a network processor, a chipset, an audio codec, a video codec, an application processor, or a SoC, without being limited thereto.

The dual second semiconductor chip 200B may include a set of memory chips including a plurality of slices (e.g., lower and upper slices 201 and 202) capable of merging data with each other. The lower slice 201 included in the second semiconductor chip 200B may include a semiconductor substrate 210 having an active surface and an inactive surface, which are opposite to each other, an upper connection pad 225, and a TSV 240 formed through the semiconductor substrate 210. In another case, the upper slice 202 may not include the upper connection pad 225 and the TSV 240.

The lower and upper slices 201 and 202 included in the second semiconductor chip 200B may be stacked and electrically connected to each other by using a direct bonding technique. That is, a connection member 230 may be omitted between the lower and upper slices 201 and 202, and the upper connection pad 225 of the lower slice 201 and the connection pad 220 of the upper slice 202 may be directly bonded and electrically connected to each other.

Figure 12:
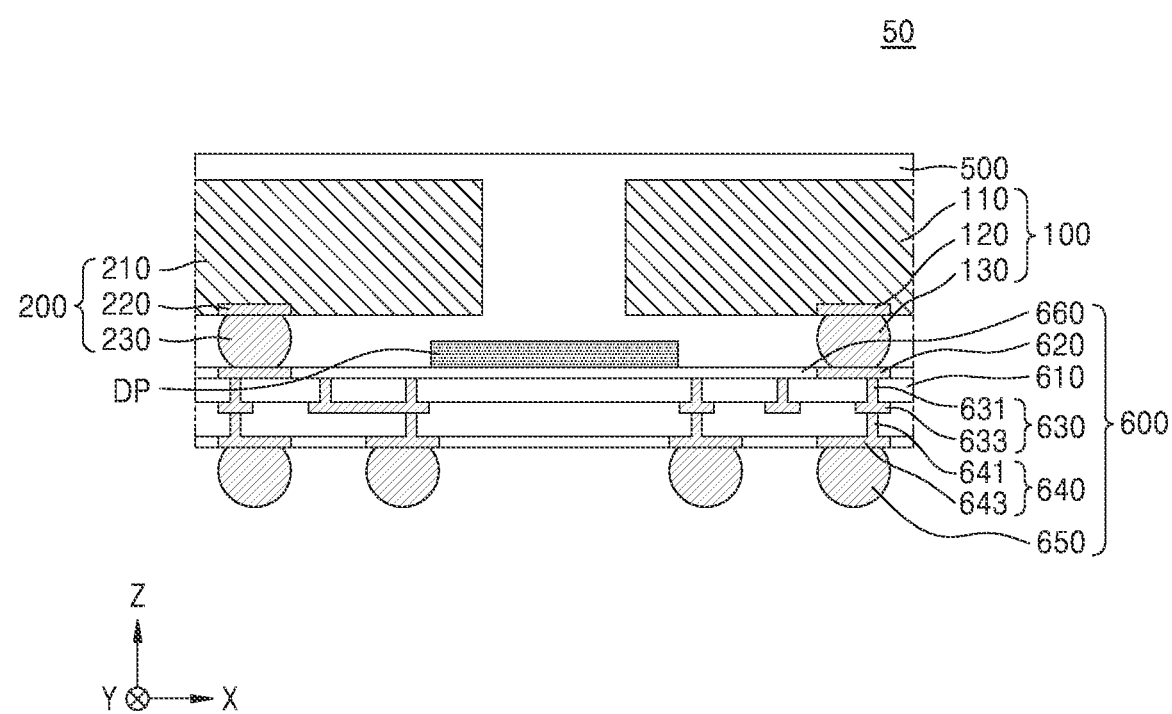

FIG. 12 illustrates a semiconductor package 50 including the first semiconductor chip 190, the second semiconductor chip 200, the molding member 500, a redistribution structure 600 and a dummy pad DP.

Here, the first and second semiconductor chips 100 and 200 and the dummy pad DP may be disposed on the redistribution structure 600. That is, the package substrate 400 of FIG. 2 may be replaced by the redistribution structure 600.

A top surface of the redistribution structure 600 may be horizontally planar. The redistribution structure 600 may include an upper electrode pad 620 and two redistribution conductive layers 630 and 640, which are formed at a redistribution insulating layer 610. However, the inventive concept is not limited thereto, and the redistribution structure 600 may include a variable number of redistribution conductive layers than the two redistribution conductive layers 630 and 640.

The redistribution conductive layers 630 and 640 may include one or more conductive material(s), such as copper (Cu), nickel (Ni), gold Au), chromium (Cr), titanium (Ti), palladium (Pd) or an alloy thereof. In some embodiments, the redistribution conductive layers 630 and 640 may be formed using an electroplating process.

The redistribution conductive layers 630 and 640 may include redistribution vias 631 and 641 and redistribution lines 633, which are in contact with the redistribution vias 631 and 641, respectively. The redistribution lines 633 may be arranged along the horizontal, planar surface, and the redistribution lines 633 may be vertically arranged in a plurality of layers.

The redistribution conductive layers 630 and 640 may electrically connect an external connection terminal 650 to the first and second semiconductor chips 100 and 200. Also, the redistribution insulating layer 610 may include an insulating protective layer around the redistribution conductive layers 630 and 640. The redistribution insulating layer 610 may include a polymer, benzocyclobutene (BCB) or a resin.

When necessary, the redistribution insulating layer 610 may include polyimide. However, a material included in the redistribution insulating layer 610 is not limited thereto. For example, the redistribution insulating layer 610 may include silicon oxide, silicon nitride, or silicon oxynitride.

The redistribution insulating layer 610 may expose a bottom surface of a lower electrode pad 643. An insulating member 660 may be formed on top of the redistribution insulating layer 610, and the dummy pad PB may be located on the insulating member 660.

The lower electrode pad 643 may be electrically connected to individual unit elements of the first and second semiconductor chips 100 and 200 through the redistribution structure 600, and thus, circuit units of the first and second semiconductor chips 100 and 200 may be electrically connected to the external connection terminal 650. That is, the lower electrode pad 643 may also be referred to as an under bump metal (UBM).

The external connection terminal 650 may be electrically connected to the redistribution structure 600 through the lower electrode pad 643. Also, the semiconductor package 50 may be electrically connected and mounted on a module substrate or a system board of an electronic product through the external connection terminal 650.

Figure 13:
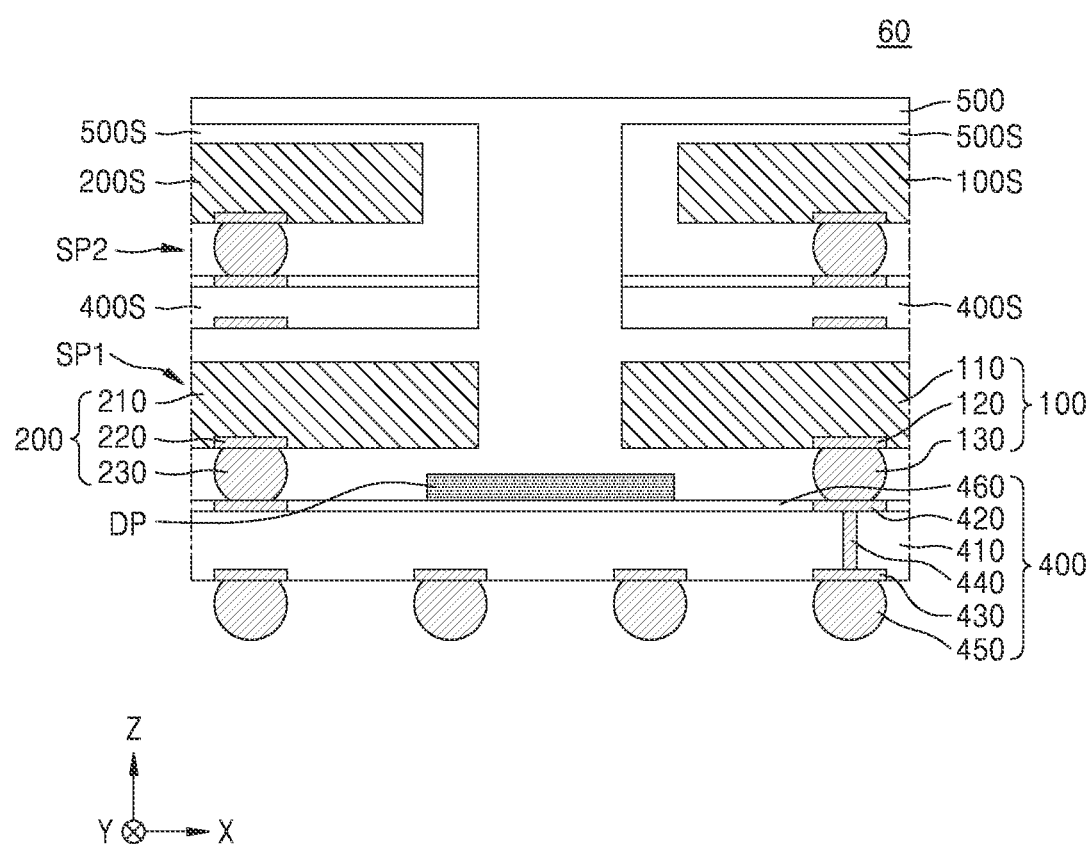

FIG. 13 illustrates a semiconductor package 60 including a first sub-package SP1 including the first semiconductor chip and the second semiconductor chip 200, a second sub-package SP2 including a fourth semiconductor chip 100S and a fifth semiconductor chip 200S, package substrates 400 and 400S, molding members 500 and 500S, and a dummy pad DP.

Configurations such as SiP and Package-on-Package (PoP) structures may be simultaneously applied to the semiconductor package according to the semiconductor package 60 according to embodiments of the inventive concept.

That is, the first sub-package SP1 including the first and second semiconductor chips 100 and 200 may be connected to the second sub-package SP2 including the fourth and fifth semiconductor chips 100S and 200S by using an inter-package connection structure (not shown) to constitute one semiconductor package 60.

The first sub-package SP1 may be substantially the same as the semiconductor package (refer to 10 in FIG. 2) described above. The second sub-package SP2 may include the fourth and fifth semiconductor chips 100S and 200S, the package substrate 400S located under the fourth and fifth semiconductor chips 100S and 200S, and the molding member 500S configured to protect the fourth and fifth semiconductor chips 100S and 200S from external influences, such as contamination and impacts.

In the semiconductor package 60 the characteristics of the first sub-package SP1 may be substantially the same as those of the second sub-package SP2.

Figure 14:
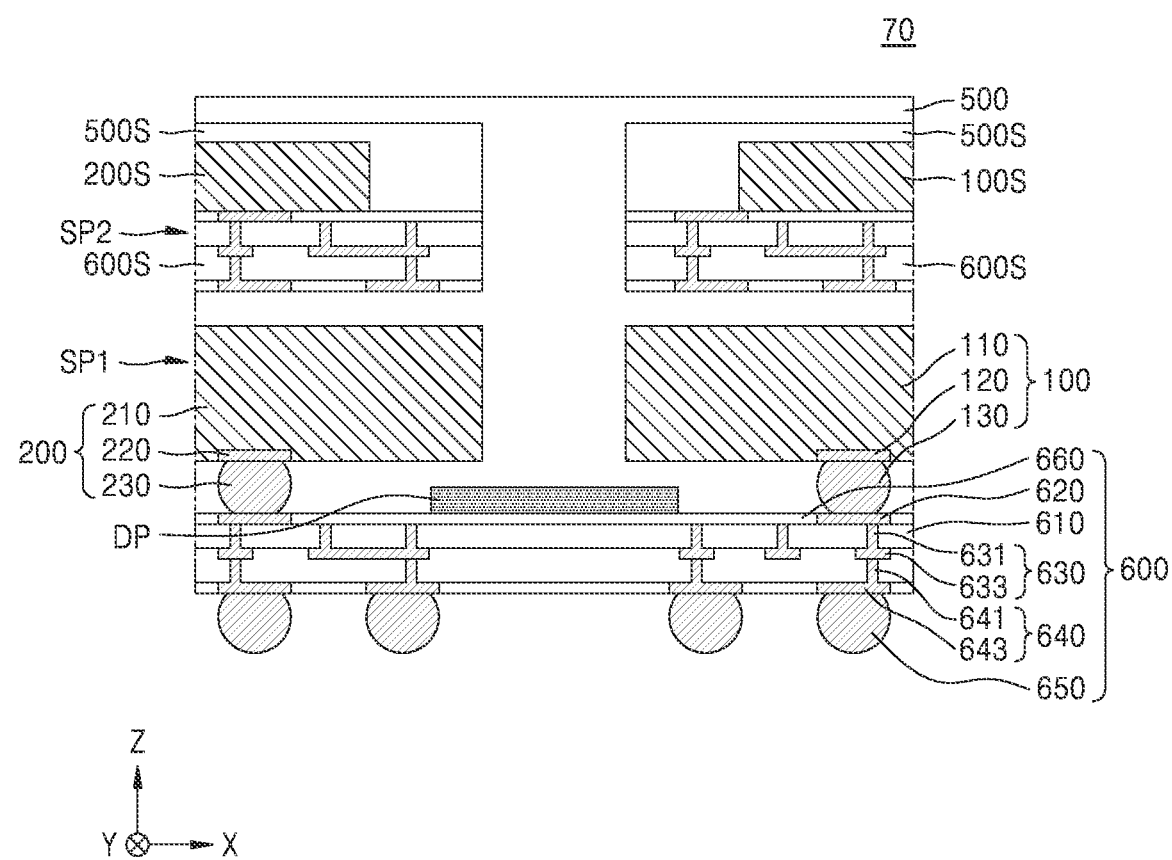

FIG. 14 illustrates a semiconductor package 70 including a first sub-package SP1 including the first semiconductor chip 100 and the second semiconductor chip 200, a second sub-package SP2 including a fourth semiconductor chip 100S and a fifth semiconductor chip 200S, molding members 500 and 500S, redistribution structures 600 and 600S and a dummy pad DP.

Configurations such as SiP and PoP structures may be simultaneously applied to the semiconductor package according to the semiconductor package 70 according to an embodiment.

That is, the first sub-package SP1 including the first and second semiconductor chips 100 and 200 may be connected to the second sub-package SP2 including the fourth and fifth semiconductor chips 100S and 200S by using an inter-package connection structure (not shown) to constitute one semiconductor package 60.

The first sub-package SP1 may be substantially the same as the semiconductor package (refer to 50 in FIG. 12) described above. The second sub-package SP2 may include the fourth and fifth semiconductor chips 100S and 200S, the redistribution structure 600S located under the fourth and fifth semiconductor chips 100S and 200S, and the molding member 500S configured to protect the fourth and fifth semiconductor chips 100S and 200S from external influences, such as contamination and impacts.

In the semiconductor package 60 according to the embodiment, characteristics of the first sub-package SP1 may be substantially the same as those of the second sub-package SP2.

Figure 15:
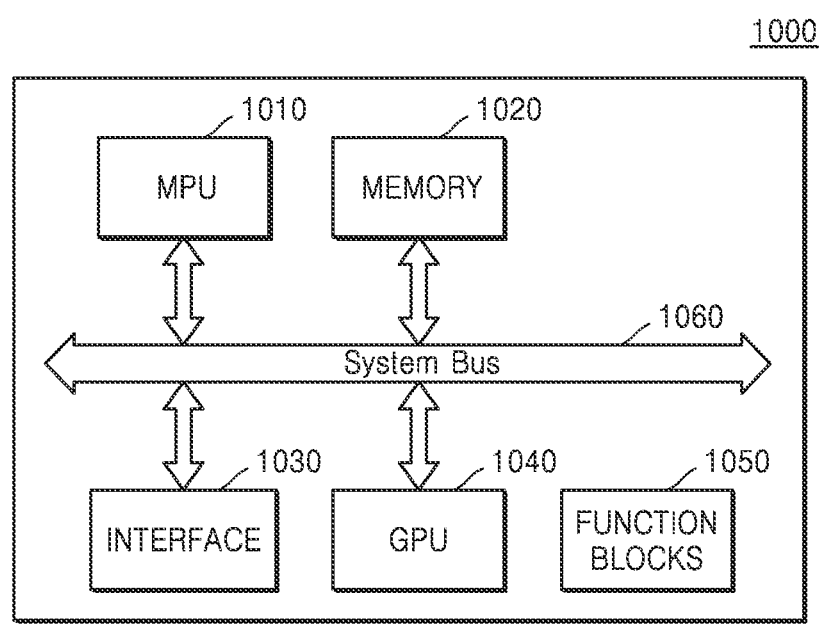
FIG. 15 is a block diagram illustrating a semiconductor package according to embodiments of the inventive concept.

FIG. 15 is a block view illustrating a semiconductor package 1000 according to embodiments of the inventive concept.

Referring to FIG. 15, the semiconductor package 1000 may include a micro-processing unit (MPU) 1010, a memory 1020, an interface 1030, a graphics processing unit (GPU) 1040, function blocks 1050, and a system bus 1060 configured to connect the MPU 1010, the memory 1020, the interface 1030, the GPU 1040, and the function blocks 1050 to each other. The semiconductor package 1000 may include at least one of the MPU 1010 and the GPU 1040.

The MPU 1010 may include a core and a cache. For example, the MPU 1010 may include a multi-core. Respective cores of the multi-core may have the same performance or different performances. Also, the respective cores of the multi-core may be activated at the same point in time or at different points in time.

The memory 1020 may store processing results of the function blocks 1050 via the control of the MPU 1010. The interface 1030 may transmit or receive information or signals to or from external devices. The GPU 1040 may perform graphics functions. For example, the GPU 1040 may perform video codec operations or process 3D graphics. The function blocks 1050 may perform various functions. For example, when the semiconductor package 1000 is an application processor used for a mobile device, some of the function blocks 1050 may perform a communication function.

The semiconductor package 1000 may include any one of the semiconductor packages 10, 10A, 10B, 10C, 20, 30, 40, 50, 60, and 70 described above with reference to FIGS. 1 to 14.

While the inventive concept has been particularly shown and described with reference to embodiments thereof, it will be understood that various changes in form and details may be made therein without departing from the spirit and scope of the following claims.

What is claimed is:

1. A semiconductor package comprising:
a package substrate;
a first semiconductor chip, a second semiconductor chip and a third semiconductor chip on the package substrate; and
a dummy pad laterally disposed between the first semiconductor chip, the second semiconductor chip and the third semiconductor chip to overlap at least a portion of the first semiconductor chip, the second semiconductor chip and the third semiconductor chip,
wherein the dummy pad is disposed on the package substrate and in a space between the package substrate and the first semiconductor chip, the second semiconductor chip and the third semiconductor chip.

2. The semiconductor package of claim 1, further comprising:
a molding member that fills the space between the package substrate and the first semiconductor chip, the second semiconductor chip and the third semiconductor chip to cover a top surface of the dummy pad.

3. The semiconductor package of claim 2, wherein the molding member extends in a T-shape from the top surface of the dummy pad.

4. The semiconductor package of claim 1, further comprising:
an under-fill that fills the space between the package substrate and the first semiconductor chip, the second semiconductor chip and the third semiconductor chip, covers a portion of a top surface of the dummy pad, and covers side surfaces of the dummy pad; and
a molding member that covers another portion of the top surface of the dummy pad.

5. The semiconductor package of claim 1, wherein the second semiconductor chip and the third semiconductor chip are arranged in parallel along one side of the first semiconductor chip,
a lateral width of the dummy pad is greater than a separating distance between the first semiconductor chip and either one of the second semiconductor chip and the third semiconductor chip, and
a longitudinal width of the dummy pad is greater than a separating distance between the second semiconductor chip and the third semiconductor chip.

6. The semiconductor package of claim 5, wherein the dummy pad overlaps the one side of the first semiconductor chip, overlaps one edge of second semiconductor chip opposing the one side of the first semiconductor chip, and overlaps one edge of the third semiconductor chip opposing the one side of the first semiconductor chip.

7. The semiconductor package of claim 1, further comprising:
an insulating film including at least one of silicon oxide and silicon nitride disposed between the package substrate and the dummy pad.

8. The semiconductor package of claim 1, wherein the package substrate comprises an interposer configured to provide electrical connection to at least one of the first semiconductor chip, the second semiconductor chip and the third semiconductor chip.

9. The semiconductor package of claim 1, wherein the dummy pad comprises a conductive metal material, and the dummy pad is electrically isolated from the package substrate, the first semiconductor chip, the second semiconductor chip and the third semiconductor chip.

10. The semiconductor package of claim 9, wherein the dummy pad has at least one of a flat panel shape in the form of a single rectangle, a stripe shape in the form of multiple parallel rectangles and a matrix shape in the form of an array of rectangles.

11. A semiconductor package comprising:
a redistribution structure;
at least three semiconductor chips on the redistribution structure;
a dummy pad between the redistribution structure and the at least three semiconductor chips; and
a molding member filling a space between the at least three semiconductor chips, such that the dummy pad overlaps at least a portion of each one of the at least three semiconductor chips, and the molding member covering at least a portion of a top surface of the dummy pad.

12. The semiconductor package of claim 11, wherein a width of the dummy pad is greater than a separating distance between any two of the at least three semiconductor chips.

13. The semiconductor package 11, wherein a bottom surface of each of the at least three semiconductor chips contacts the molding member, and a bottom surface of the dummy pad contacts an insulating film formed on the redistribution structure and including at least one of silicon oxide and silicon nitride.

14. The semiconductor package of claim 11, wherein the dummy pad is electrically isolated.

15. The semiconductor package of claim 11, one of the at least three semiconductor chips has a stacked structure including a plurality of slices, and another one of the least three semiconductor chips has a single layer structure.

16. A semiconductor package comprising:

an interposer;

semiconductor chips disposed adjacent to each other on the interposer, the semiconductor chips including a memory chip, a logic chip and a dummy chip;

a dummy pad disposed on the interposer and between the interposer and the semiconductor chips, wherein the dummy pad includes a metal material;

a molding member covering a bottom surface and side surfaces of the semiconductor chips, wherein the molding member covers a top surface and side surfaces of the dummy pad; and a solder bump adhered to a bottom surface of the interposer, wherein the dummy pad overlaps at least a portion of each one of the semiconductor chips.

17. The semiconductor package of claim 16, wherein the dummy pad overlaps a side of the logic chip, and overlaps an edge of each one of the memory chip and the dummy chip.

18. The semiconductor package of claim 17, wherein a first planar area where the dummy pad overlaps the logic chip is greater than each of a second planar area where the dummy pad overlaps the memory chip and a third planar area where the dummy pad overlaps the dummy chip.

19. The semiconductor package of claim 16, wherein the memory chip is a high-bandwidth memory chip and is a stacked structure including a plurality of slices.

20. The semiconductor package of claim 16, wherein a width of the dummy pad is greater than a maximum distance separating the semiconductor chips.

* * * * *